(12) United States Patent
Takai et al.

(10) Patent No.: US 6,352,880 B1
(45) Date of Patent: Mar. 5, 2002

(54) SEMICONDUCTOR DEVICE AND MANUFACTURE THEREOF

(75) Inventors: Masami Takai, Tokyo; Akira Nakamura, Chiba; Satoshi Takeda, Tokyo; Tatsuya Matsuki, Kanagawa, all of (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 09/647,509

(22) PCT Filed: Mar. 26, 1999

(86) PCT No.: PCT/JP99/01569

§ 371 Date: Sep. 29, 2000

§ 102(e) Date: Sep. 29, 2000

(87) PCT Pub. No.: WO99/50912

PCT Pub. Date: Oct. 7, 1999

(30) Foreign Application Priority Data

Apr. 1, 1998 (JP) .......................................... 10-088518

(51) Int. Cl.⁷ ............................................. H01L 21/44
(52) U.S. Cl. ........................................................ 438/106
(58) Field of Search .......................... 438/106, 15, 16, 438/107, 108, 112, 455, 463, 795, 799, 124, 126

(56) References Cited

U.S. PATENT DOCUMENTS

| | | | | |
|---|---|---|---|---|
| 3,768,157 A | * | 10/1973 | Buie | 29/613 |
| 3,827,142 A | * | 8/1974 | Bennett et al. | 29/620 |
| 4,439,754 A | * | 3/1984 | Madden, Jr. | 338/320 |

FOREIGN PATENT DOCUMENTS

| | | |
|---|---|---|
| JP | 594905 | 4/1993 |
| JP | 613148 | 2/1994 |

* cited by examiner

*Primary Examiner*—David Nelms
*Assistant Examiner*—Quoc Hoang
(74) *Attorney, Agent, or Firm*—Cooper & Dunham LLP

(57) ABSTRACT

A semiconductor device production method of the invention includes a step of packaging a semiconductor chip with a transparent material (14) which penetrates a laser beam (13) within a predetermined range of wavelength having sufficient energy to cut part of an adjustable circuit (12), and a step of trimming part of the adjustable circuit (12) to obtain a target value of electric properties for the adjustable circuit by focusing, after the packaging step, the laser beam (13) onto the adjustable circuit from an upper surface of the semiconductor chip through the transparent material.

7 Claims, 4 Drawing Sheets

US 6,352,880 B1

SEMICONDUCTOR DEVICE AND MANUFACTURE THEREOF

FIELD OF INVENTION

The present invention generally relates to a semiconductor device production method and a semiconductor device, and more particularly to a production method of a semiconductor device in which an adjustable circuit, having a circuit element with electric properties adjustable through a laser trimming, is formed on a semiconductor chip, and to the semiconductor device produced by the method of production.

BACKGROUND OF THE INVENTION

As disclosed in Japanese Laid-Open Utility Model Application No.6-13148, there is known a semiconductor device in which a semiconductor chip is packaged or molded with a transparent material. FIG. 3 shows such a semiconductor device that is disclosed in the above-mentioned publication.

In the semiconductor device of FIG. 3, an IC (integrated circuit) chip is packaged or molded with a transparent plastic material. The wafer chip within the semiconductor device is visible from a corresponding portion 1A for the transparent plastic material, and only the portion 1A can penetrate a UV (ultraviolet) light. The remaining portions 5A of the upper surface of the semiconductor device are coated, printed or vacuum-deposited with an opaque material so that the remaining portions are opaque to external light.

In the semiconductor device disclosed in the above publication, the IC chip packaged with the transparent plastic material is an EPROM (erasable programmable read-only memory) in which data of the integrated circuit (IC) on the semiconductor device is erasable by irradiating UV light externally to the IC through the transparent plastic portion.

Further, as disclosed in Japanese Laid-Open Patent Application No.5-94905, there is known a production method that produces a semiconductor device including an adjustable resistor formed on a semiconductor chip, the adjustable resistor having electric resistance adjustable through a laser trimming. FIG. 4 shows such a production method that is disclosed in the above-mentioned publication.

As shown in FIG. 4, in the conventional production method, a semiconductor device 2B on a substrate 1B is coated with an opaque resin 5B, and a resistor 3B is separately formed on the substrate 1B. After the coating is performed, a laser beam 6B is irradiated to the resistor 3B to cut part of the resistor 3B so that the electric resistance of the resistor 3B is adjusted through the laser trimming. It is possible for the conventional production method to adjust the resistance of the resistor 3B without altering the adjustment resistance values of the semiconductor device 2B that are already finalized.

In the conventional production method of FIG. 4, a tester 7B is used to observe the resistance values of the semiconductor device 2B before and after the laser trimming is performed. The opaque resin 5B which fully covers the semiconductor device 2B serves to inhibit the laser beam 6B from influencing the resistance values of the semiconductor device 2B.

In the IC chip requiring the laser trimming (or the semiconductor device of the above type), the adjustable circuit including a circuit element, such as a fuse or a wiring, is formed on the semiconductor chip, and the electric properties of the circuit element, such as voltage, current or frequency values, are adjustable through the laser trimming.

Herein, the laser trimming means that the whole or a part of the circuit element be cut away by irradiation of a laser beam. However, it is possible to extend the meaning of the laser trimming to include connection or welding operations to establish a connection of the wiring by irradiation of a laser beam.

In the above-described semiconductor device, the laser trimming is normally performed with the semiconductor chip in the wafer condition, and thereafter the assembly process is performed so that the semiconductor device is packaged.

More specifically, when the delivery of the products or samples of the semiconductor device of the above type to the customer is needed, it is necessary to perform the laser trimming with the semiconductor chip in the wafer condition, so that the electric properties of the adjustable circuit element in the semiconductor device, such as voltage, current or frequency values, are adjusted by the laser trimming so as to be in conformity with the customer's demanded values. Hereinafter, the needed laser trimming operation is called the user customizing operation.

When performing the user customizing operation, the laser trimming is performed with the semiconductor chip in the wafer condition to meet the customer demands, and thereafter the assembly process is performed so that the semiconductor chip is packaged. Finally, the final test is conducted, and the products or samples of the semiconductor device, passing the final test, are delivered to the customer.

In the assembly process, the semiconductor chip is cut off from the wafer, and the semiconductor chip is mounted on the tab. After the mounting is performed, the wire bonding is performed between the semiconductor chip, mounted on the tab, and the lead frame. After the wire bonding is performed, the semiconductor chip, connected to the lead frame by the wires, is packaged with the resin or molding material. Hereinafter, the assembly process will be considered as the assembly process including these steps.

In the final test, it is determined whether the semiconductor chip that is packaged with the resin material at the end of the assembly process meets the customer demands. Then, the products or samples of the semiconductor device passing the final test are delivered to the customer.

However, in the semiconductor device of FIG. 3, the data of the integrated circuit on the EP-ROM is erasable by irradiating UV light externally to the IC through the transparent plastic portion 1A. Hence, the UV light used in the semiconductor device of FIG. 3 is quite different from the laser beam used in the semiconductor device in which the adjustable circuit having the circuit element with electric properties adjustable through the laser trimming is formed on the semiconductor chip.

Further, in the semiconductor device production method of FIG. 4, the opaque resin 5B which fully covers the semiconductor device 2B serves to inhibit the laser beam 6B from influencing the resistance values of the semiconductor device 2B. It is impossible to adjust the resistance values of the semiconductor device 2B by irradiating the laser beam to the semiconductor device 2B through the opaque resin 5B. There is a problem in that it is difficult for the production method of FIG. 4 to perform the laser trimming for adjusting the electric properties of the circuit elements in the semiconductor device 2B that is fully covered with the opaque resin 5B.

As described above, in a conventional production method, when performing the user customizing operation, the laser trimming is performed with the semiconductor chip in the wafer condition to meet the customer demands, the assembly process is subsequently performed so that the semiconductor chip is packaged, and finally, the final test is conducted so that the products or samples of the semiconductor device, passing the final test, are delivered to the customer. Normally, when the conventional production method is used, it takes one through three months from the receiving of the customer's order to the delivery of the products or samples to the customer. The above conventional production method is difficult to provide speedy delivery of the products or samples to the customer in response to the customer's order. Further, it is difficult to obtain the customer satisfaction with the conventional production method.

A conceivable method for shortening the period from the receiving of the customer's order to the delivery of the products or samples to the customer is to always prepare a large stock for each of the samples of the semiconductor device that are expected to respectively meet various kinds of the customer demands. However, the cost for the preparation of the large stock is significantly increased. In addition, the conventional production method which requires the repetitive user customizing operation, including the laser trimming, the assembly process and the final test, each time the customer's order is received, is not efficient in increasing the productivity.

In the above-described user customizing operation, the packaging of the semiconductor chip with the resin material is performed after the laser trimming is performed. The electric properties of the circuit element adjusted by the laser trimming may be considerably influenced by the stress or heat produced during the packaging process. If the electric properties of the circuit element are changed by the stress or heat during the packaging process, it is very difficult to restore the electric properties of the circuit element adjusted by the laser trimming.

SUMMARY OF THE INVENTION

In order to overcome the problems described above, preferred embodiments of the present invention provide an improved semiconductor device production method which reduces the amount of stock needed for each of the samples of the semiconductor device that are expected to respectively meet various kinds of the customer demands, and shortens the period from the receiving of the customer's order to the delivery of the products or samples to the customer in order to allow speedy delivery of the products or samples to the customer in response to the customer's order.

Another object of the present invention is to provide an improved semiconductor device which reduces the amount of stock needed for each of the samples of the semiconductor device that are expected to respectively meet various kinds of the customer demands, and shortens the period from the receiving of the customer's order to the delivery of the products or samples to the customer in order to allow speedy delivery of the products or samples to the customer in response to the customer's order.

Another object of the present invention is to provide a semiconductor device production method and a semiconductor device which eliminates the need to always prepare a large stock for each of the samples of the semiconductor device that are expected to respectively meet various kinds of the customer demands, so that the amount of the stock is effectively reduced.

Another object of the present invention is to provide a semiconductor device production method and a semiconductor device which can restore the electric properties of the circuit element of the adjustable circuit to the initial level by a subsequent laser trimming even when the electric properties of the circuit element adjusted by the initially performed laser trimming are changed by the stress or heat during an extended period of time.

The above-mentioned objects of the present invention are achieved by a semiconductor device production method for producing a semiconductor device in which an adjustable circuit is formed on a semiconductor chip, the adjustable circuit having a circuit element with electric properties that are adjustable through a laser trimming, the production method including the steps of: packaging the semiconductor chip with a transparent material which penetrates a laser beam within a predetermined range of wavelength having sufficient energy to cut part of the adjustable circuit; and trimming part of the adjustable circuit to obtain a target value for the adjustable circuit by focusing, after the packaging step, the laser beam onto the adjustable circuit from an upper surface of the semiconductor chip through the transparent material.

According to the semiconductor device production method of the above preferred embodiment, the assembly process is performed, in advance, for the semiconductor device to which the laser trimming is not entirely or partially performed, and a small stock of products or samples of the semiconductor device is prepared. At the time of receiving of the customer's order, the user customizing operation is performed for the stock of the products or samples of the semiconductor device so that the laser trimming is performed to meet the customer demands. The assembly process of the user customizing operation required by the conventional production method is no longer needed. After the laser trimming is performed, the final test is conducted so that the products or samples of the semiconductor device, passing the final test, are delivered to the customer. Therefore, the semiconductor device production method of the above preferred embodiment is effective in reducing the amount of stock needed and in shortening the period from the receiving of the customer's order to the delivery of the products or samples to the customer. It is possible for the semiconductor device production method of the above preferred embodiment to provide speedy delivery of the products or samples to the customer in response to the customer's order and to easily obtain the customer satisfaction.

As the speedy delivery of the products or samples to the customer is possible, the semiconductor device production method of the above preferred embodiment is effective in eliminating the need to always prepare a large stock for each of the samples of the semiconductor device that are expected to respectively meet various kinds of the customer demands, and effective in increasing the productivity.

According to the semiconductor device production method of the above preferred embodiment, even when the electric properties of the circuit element of the adjustable circuit adjusted by an initially performed laser trimming are changed by the stress or heat during an extended period of time, the electric properties of the circuit element can be restored to the initial level by a subsequent laser trimming.

Further, the above-mentioned objects of the present invention are achieved by a semiconductor device which includes a semiconductor chip and an adjustable circuit provided on the semiconductor chip, the adjustable circuit having a circuit element with electric properties that are adjustable through a laser trimming, wherein the semiconductor chip is packaged with a transparent material which penetrates a laser beam within a predetermined range of wavelength having sufficient energy to cut part of the adjustable circuit, and the semiconductor device is configured such that part of the adjustable circuit is cut to obtain a target value for the circuit element of the adjustable circuit by focusing, after the packaging of the semiconductor chip, the laser beam onto the adjustable circuit from an upper surface of the semiconductor chip through the transparent material.

According to the semiconductor device of the above preferred embodiment, the assembly process, including the packaging process, is performed, in advance, for the semiconductor chip to which the laser trimming is not entirely or partially performed, and a small stock of samples of the semiconductor device is prepared. At the time of receiving of the customer's order, the user customizing operation is performed for the semiconductor device so that the laser trimming is performed to meet the customer demands. After the laser trimming is performed, the final test is conducted so that the products or samples of the semiconductor device, passing the final test, are delivered to the customer. Therefore, the semiconductor device of the above preferred embodiment is effective in reducing the amount of stock needed and in shortening the period from the receiving of the customer's order to the delivery of the products or samples to the customer. It is possible for the semiconductor device of the above preferred embodiment to allow speedy delivery of the products or samples to the customer in response to the customer's order and to obtain the customer satisfaction.

BRIEF DESCRIPTION OF THE DRAWINGS

Other objects, features and advantages of the present invention will be apparent from the following detailed description when read in conjunction with the accompanying drawings.

PREFERRED EMBODIMENTS OF THE INVENTION (First Preferred Embodiment)

A description will now be provided of a first preferred embodiment of the present invention with reference to the accompanying drawings.

Figure 1:
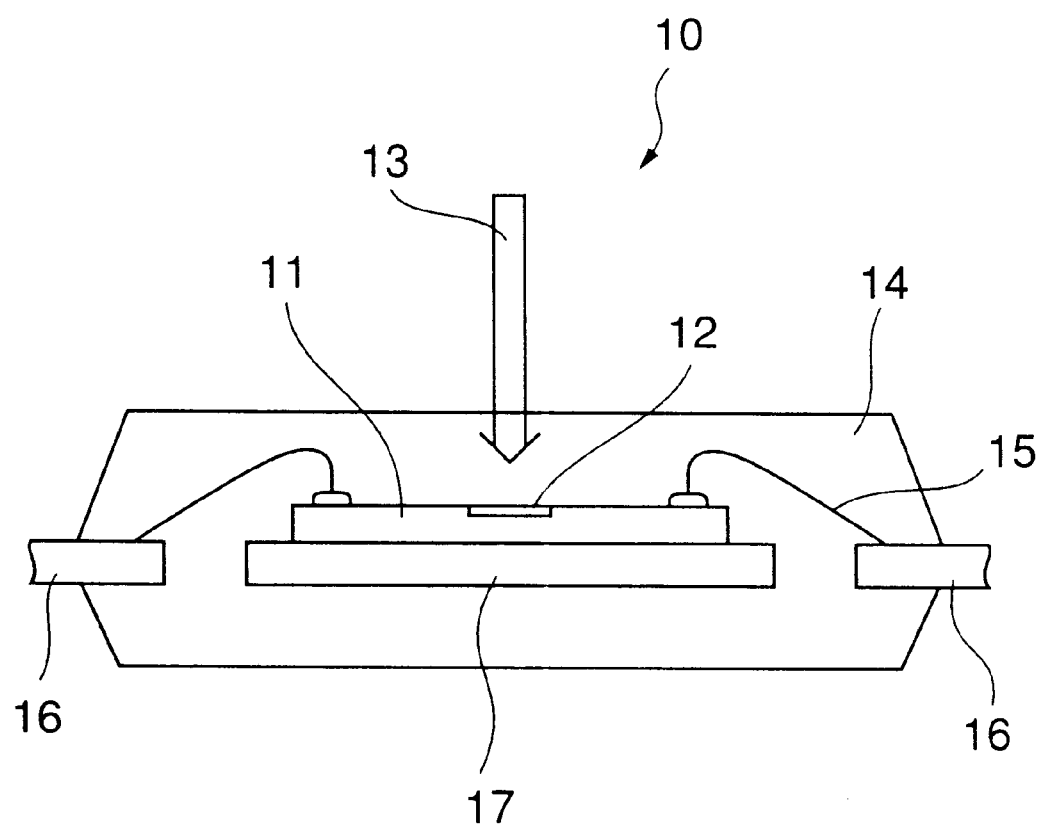
FIG. 1 is a cross-sectional view of one preferred embodiment of the semiconductor device of the invention.

FIG. 1 is a cross-sectional view of one preferred embodiment of the semiconductor device of the invention.

In the semiconductor device of FIG. 1, an adjustable circuit 12, which has a circuit element with electric properties that are adjustable through a laser trimming, is formed on a semiconductor chip. The semiconductor chip is packaged with a transparent material 14, which penetrates a laser beam 13 within a predetermined range of wavelength (between λ1 and λ2) having sufficient energy to cut part of the adjustable circuit 12.

The electric properties of the circuit element of the adjustable circuit that are adjustable through the laser trimming in the present embodiment may be detection voltage values, output voltage values, oscillation frequency values, or output current values.

The semiconductor device of the present embodiment may be one of various integrated circuits (IC), including a voltage regulator IC, a voltage detector IC, a DC/DC converter IC and a constant current IC, or one of various sensors, including a temperature sensor, a humidity sensor, a gas sensor and an acceleration sensor. In the following description, suppose that the semiconductor device of FIG. 1 is a voltage regulator 10.

On the semiconductor chip 11 of the voltage regulator 10 in the present embodiment, as shown in FIG. 1, a fuse, a wiring or a resistor for the laser trimming is formed as the adjustable circuit 12 having such circuit element with the electric properties that are adjustable through the laser trimming. The fuse, the wiring or the resistor is formed on the semiconductor chip 11 and provided for the laser trimming. When the laser beam 13 is focused onto the fuse, the wiring or the resistor during the laser trimming, the electric properties of the fuse, the wiring or the resistor, such as the detection voltage values, the output voltage values, the oscillation frequency values or the output current values, are adjusted to a target value of the electric properties.

The material of the fuse, the wiring or the resistor in the present embodiment may be one of various metals, including aluminum (Al), gold (Au), copper (Cu), platinum (Pt), titanium (Ti) and tungsten (W), polysilicon, silicon diffusion layers, or the like.

The material of a protective layer on the top of the fuse, the wiring or the resistor in the present embodiment may be one of conventional protective layer materials, including a silicon dioxide ($SiO_2$) layer, a PSG layer, a BPSG layer and a silicon nitride (SiN) layer. The dielectric layers or passivation layers conventionally used between the wirings may be used as the protective layer for the adjustable circuit 12. Preferably, the non-rigid, film-type protective layer is suitable, and the thickness of the protective layer on the top of the fuse, the wiring or the resistor may be the same as or slightly larger than that of the conventional protective layers. In addition, a polyimide layer may be used as the protective layer for the adjustable circuit 12 if the thickness of the polyimide layer is reduced to a reasonable level. If the polyimide layer has a substantially large thickness on the top of the fuse, it may reduce the transmittancy of the laser beam within the adjustable circuit 12.

A typical example of the adjustable circuit 12 included in the voltage regulator 10 of the present embodiment may be a ladder resistor that is provided for adjustment of the reference voltage or the reference current of the voltage regulator 10.

In the following description, suppose that the adjustable circuit in the voltage regulator 10 of the present embodiment is a ladder resistor 12, and that, through the laser trimming, part of the ladder resistor 12 is cut to obtain a target value of resistance of the ladder resistor for the voltage regulator 10.

The laser, which is used for the laser trimming in the present embodiment, may be a solid-state laser, such as a YAG (yttrium aluminum garnet) laser (the basic oscillation wavelength=1.06 μm), or a gas laser, such as a $CO_2$ laser (the basic oscillation wavelength=10.6 μm). In the following description, suppose that the laser used in the laser trimming is the YAG laser. The basic oscillation wavelength of the YAG laser is about 1064 nm. When the second harmonic of the YAG laser is used, the second harmonic wavelength thereof is about 532 nm (=1064/2). When the third harmonic of the YAG laser is used, the third harmonic wavelength thereof is about 355 nm (1064/3). Hence, the predetermined range of wavelength of the laser beam 13 in the present embodiment is approximately in a range between 300 nm and 1100 nm.

The transparent material 14, which is used for the packaging of the semiconductor chip 11 in the present embodiment, has a transmittancy to penetrate the laser beam 13 within the predetermined range of wavelength (approximately in the range between 300 nm and 1100 nm) having sufficient energy to cut part of the adjustable circuit 12 on the semiconductor chip 11. The transparent material 14 in the present embodiment has a sufficiently low rate of absorption of energy to the laser beam 13. Preferably, the rate of absorption of energy of the transparent material 14 that is below 20% is suitable for practical applications. The transparent material 14 in the present embodiment is an epoxy resin sealing material that meets the above-mentioned requirements on the transmittancy and the rate of absorption of energy.

Next, a description will be given of one preferred embodiment of the semiconductor device production method of the invention for producing the voltage regulator 10 of FIG. 1.

Figure 2A:
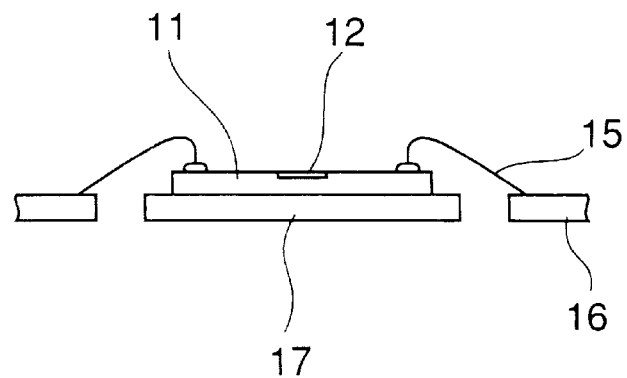
FIG. 2A, FIG. 2B and FIG. 2C are diagrams for explaining steps of one preferred embodiment of the semiconductor device production method of the invention, which produces the semiconductor device of FIG. 1.
Figure 2B:
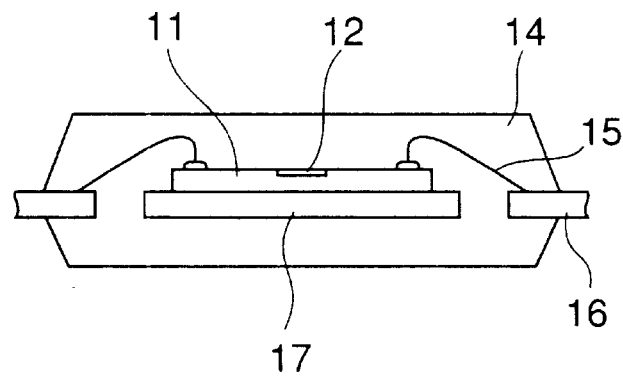
Figure 2C:
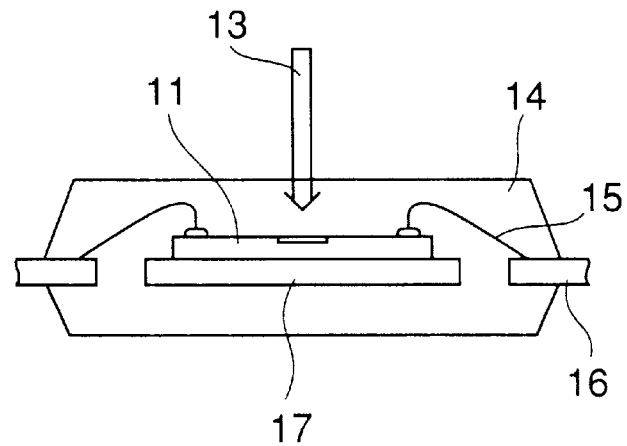
Figure 3:
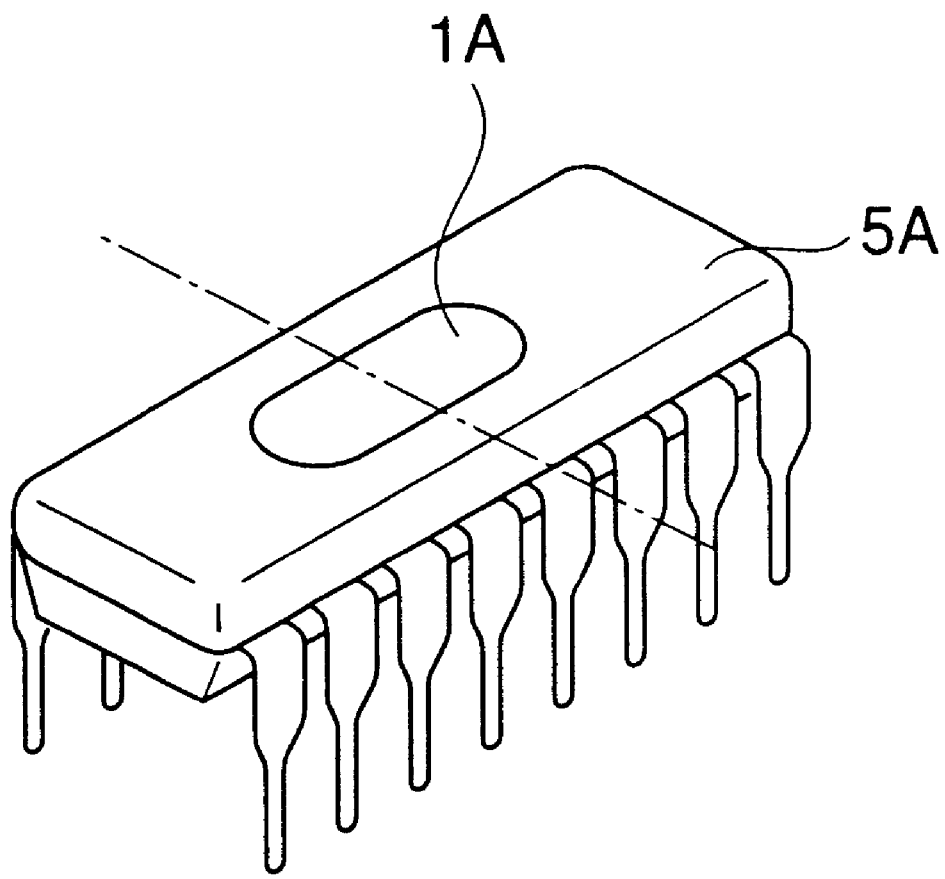
FIG. 3 is a perspective view of a conventional semiconductor device.
Figure 4:
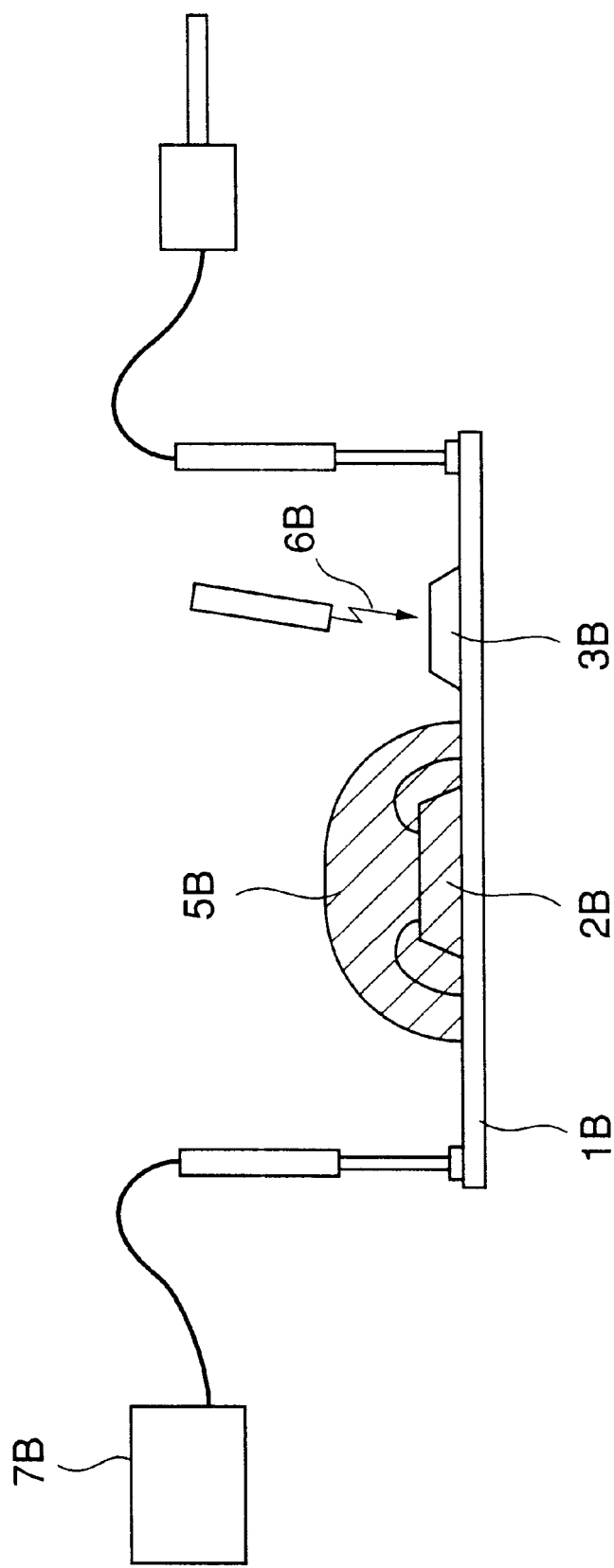
FIG. 4 is a diagram for explaining a conventional semiconductor device production method.

FIG. 2A, FIG. 2B and FIG. 2C are diagrams for explaining steps of one preferred embodiment of the semiconductor device production method of the invention for producing the voltage regulator 10 of FIG. 1.

The packaging method, which is used in the production method of the present embodiment, may be one of various packaging methods, including transfer molding, potting, dipping and injection molding. The packaging material, which is used in the production method of the present embodiment, may be firmly attached to the above-mentioned protective layer on the top of the fuse, the wiring or the resistor after the packaging process is performed. Alternatively, the packaging material may not come into direct contact with the protective layer after the packaging process is performed. In such alternative embodiment, an internal space may exist between the packaging material and the protective layer, and the internal space may be filled with an inert gas or the like.

The form of the package 14, which is used in the production method of the present embodiment, may be one of a wide variety of forms including a chip size package (CSP), a ball grid array (BGA) package, a quad flat package (QFP), a small outline package (SOP), and a dual in-line package (DIP).

At a start of the semiconductor device production method of the present embodiment, the assembly process is performed. In the assembly process, the semiconductor chip 11 is cut off from the wafer, and the semiconductor chip 11 is mounted on the tab 17. After the mounting is performed, the wire bonding is performed between the semiconductor chip 11, mounted on the tab 17, and the lead frame 16, so that electric connections between the semiconductor chip 11 and the lead frame 16 are established by wires 15 as shown in FIG. 2A. After the wire bonding is performed, the semiconductor chip 11, which is connected to the lead frame 16 by the wires 15, is packaged with the epoxy resin sealing material 14 (or the transparent material) as shown in FIG. 2B. As described above, the assembly process, which is performed in the semiconductor device production method of the present embodiment, includes the cutting step, the mounting step, the wire bonding step and the packaging step.

After the packaging process is performed, the laser trimming is performed in the semiconductor device production method of the present embodiment. Through the laser trimming, part of the ladder resistor 12 is cut to obtain a target value of resistance of the ladder resistor 12 for the voltage resistor 10. Specifically, as shown in FIG. 2C, the ladder resistor 12 is formed on the semiconductor chip 11 in the voltage regulator 10, and part of the ladder resistor 12 is cut to obtain a target value of resistance of the ladder resistor 12 by focusing the laser beam 13 onto the ladder resistor 12 from the upper surface of the semiconductor chip 11 through the transparent material 14.

In the semiconductor device production method of the present embodiment, the packaging process is performed for the voltage regulator 10 to which the laser trimming is not entirely or partially performed. In the packaging process of the present embodiment, a transparent-type epoxy resin sealing material 14, not the black epoxy resin sealing material that is commonly used, is used. Hence, in the semiconductor device production method of the present embodiment, it is possible to carry out the laser trimming for the semiconductor device after the packaging process is performed.

In the semiconductor device production method of the present embodiment, the packaging process is performed so that the semiconductor chip 11 is packaged with the transparent epoxy resin sealing material 14, which penetrates the YAG laser beam 13 within the predetermined range of wavelength (approximately in the range between 300 nm and 1100 nm as described above) having sufficient energy to cut part of the ladder resistor 12. Then, the package of the semiconductor chip 11 is formed into a predetermined configuration.

In the semiconductor device production method of the present embodiment, after the packaging process is performed, the trimming process is performed so that part of the ladder resistor 12 is cut or cut off to obtain a target value of resistance of the ladder resistor 12 by focusing the YAG laser beam 13 onto the ladder resistor 12 from the upper surface of the semiconductor chip 11 through the transparent epoxy resin sealing material 14.

After the trimming process is performed, the transparent package of the semiconductor chip 11 may be used without modification. Alternatively, when the necessity arises, the transparent package of the semiconductor chip 11 after the trimming process is performed may be coated, printed or vacuum-deposited with an opaque material.

According to the semiconductor device production method of the above-described embodiment, a small stock of the products or samples of the voltage regulator 10 for which the assembly process, including the packaging process, is performed, in advance, without performing the trimming process for the semiconductor chip 11, is prepared, and at the time of receiving of the customer's order, the user customizing operation is performed for the stock of the products or samples of the voltage regulator 10 in order of the laser trimming and the final test. The assembly process of the user customizing operation required by the conventional production method is no longer needed. After the laser trimming is performed, the final test is conducted so that the products or samples of the voltage regulator 10, passing the final test, are delivered to the customer.

In the final test, which is performed in the semiconductor device production method of the present embodiment, it is determined whether the resistance of the ladder resistor 12 on the semiconductor chip 11 for which the laser trimming is performed meets the customer demanded value.

As described in the foregoing, according to the semiconductor device production method of the present embodiment, the packaging process is performed, in advance, for the semiconductor chip for which the laser trimming is not entirely or partially performed, and a small stock of products or samples of the semiconductor device is prepared, and, at the time of receiving of the customer's order, the user customizing operation is performed for the stock of the products or samples of the semiconductor device so that the laser trimming is performed to meet the customer demands. The assembly process of the user customizing operation required by the conventional production method is no longer needed. After the laser trimming is performed, the final test is conducted so that the products or samples of the semiconductor device, passing the final test, are delivered to the customer.

Accordingly, the semiconductor device production method and the semiconductor device of the above-described embodiment are effective in reducing the amount of stock needed and in shortening the period from the receiving of the customer's order to the delivery of the products or samples to the customer. It is possible for the semiconductor device production method and the semiconductor device of the above-described embodiment to provide speedy delivery of the products or samples to the customer in response to the customer's order and to easily obtain the customer satisfaction.

As the speedy delivery of the products or samples to the customer is possible, the semiconductor device production method and the semiconductor device of the above-described embodiment are effective in eliminating the need to always prepare a large stock for each of the samples of the semiconductor device that are expected to respectively meet various kinds of the customer demands, and effective in increasing the productivity.

According to the semiconductor device production method and the semiconductor device of the above-described embodiment, even when the electric properties of the circuit element of the adjustable circuit adjusted by an initially performed laser trimming are changed by the stress or heat during an extended period of time, the electric properties of the circuit element can be restored to the initial level by a subsequent laser trimming.

(Second Preferred Embodiment)

Next, a description will be provided of a second preferred embodiment of the voltage regulator 10 of the invention. In the following description, the elements which are essentially the same as corresponding elements in the first preferred embodiment are designated by the same reference numerals, and a duplicate description thereof will be omitted.

In the voltage regulator 10 of the present embodiment, the transparent material 14, which is the transparent epoxy resin sealing material in the first preferred embodiment, is constituted by a molded resin with a satin finished surface. When the semiconductor chip 11 is packaged with the molded resin, the resulting package 14 of the molded resin that fully covers the semiconductor chip 11 has a satin finished surface. The satin finished surface of the package 14 reflects light to some extent but is not very shiny like a frosted glass. When the molded resin package 14 of the semiconductor chip 11 has the satin finished surface, the YAG laser beam 13 is reflected on the satin finished surface of the package 14 and it is hard to focus the YAG laser beam 13 onto the adjustable circuit 12 from the upper surface of the semiconductor chip 11 through the package 14.

To eliminate the problem, in the voltage regulator 10 of the present embodiment, a surface treatment is performed for the satin finished surface of the molded resin package 14 of the semiconductor chip 11 after the packaging process is performed and before the trimming process is performed. The surface treatment is performed by applying one of water or oil to the satin finished surface of the transparent material 14 to which the YAG laser beam 13 is incident in the subsequent trimming process, so as to allow the satin finished surface of the transparent material 14 after the surface treatment is performed to easily pass through the YAG laser beam 13. This process is called the surface treating process. In the semiconductor device production method of the second preferred embodiment of the invention, the above-described surface treating process is added following the packaging process and preceding the trimming process.

In the following description, suppose that the transparent material 14, which is used in the semiconductor device production method of the present embodiment, is the molded resin 14 with the satin finished surface.

The molded resin 14 with the satin finished surface in the present embodiment, after the above-described surface treating process is performed, has a transmittancy to penetrate the YAG laser beam 13 within the predetermined range of wavelength (approximately in the range between 300 nm and 1100 nm) having sufficient energy to cut part of the adjustable circuit 12 on the semiconductor chip 11. The molded resin 14 with the satin finished surface in the present embodiment, after the above-described surface treating process is performed, has a sufficiently low rate of absorption of energy to the YAG laser beam 13. Preferably, the rate of absorption of energy of the molded resin 14 that is below 20% is suitable for practical applications.

The packaging method and the form of the package (the molded resin 14), which are used in the semiconductor device production method of the present embodiment, are essentially the same as those of the first preferred embodiment.

The assembly process, which is performed in the semiconductor device production method of the present embodiment, is essentially the same as that of the first preferred embodiment.

After the packaging process is performed, the satin finished surface of the molded resin package 14 to which the YAG laser beam 13 is incident is surface treated by applying one of water and oil to the satin finished surface of the molded resin package 14, so as to allow the satin finished surface of the package 14 to easily pass through the YAG laser beam 13.

After the surface treating process is performed, the laser trimming, which is similar to that of the first preferred embodiment, is performed in the present embodiment. Through the laser trimming, part of the ladder resistor 12 is cut to obtain a target value of resistance of the ladder resistor 12 for the voltage resistor 10.

In the semiconductor device production method of the present embodiment, the surface treating process is performed after the packaging process is performed. In the surface treating process, the satin finished surface of the molded resin package 14 to which the YAG laser beam 13 is incident is surface treated by applying one of water and oil to the satin finished surface of the molded resin package 14, so as to allow the satin finished surface of the package 14 after the surface treatment to easily pass through the YAG laser beam 13.

In the semiconductor device production method of the present embodiment, after the surface treating process is performed, the trimming process is performed so that part of the ladder resistor 12 is cut or cut off to obtain a target value of resistance of the ladder resistor 12 by focusing the YAG laser beam 13 onto the ladder resistor 12 from the upper surface of the semiconductor chip 11 through the molded resin package 14 which is surface treated by applying one of water and oil to the satin finished surface of the package 14.

Accordingly, the semiconductor device production method of the above-described embodiment achieves the advantageous features that are essentially the same as those of the semiconductor device production method of the first preferred embodiment.

As described in the foregoing, according to the semiconductor device production method of the present invention, the packaging process is performed, in advance, for the semiconductor chip for which the laser trimming is not entirely or partially performed, and a small stock of products or samples of the semiconductor device is prepared, and, at the time of receiving of the customer's order, the user customizing operation is performed for the stock of the products or samples of the semiconductor device so that the laser trimming is performed to meet the customer demands. The assembly process of the user customizing operation required by the conventional production method is no longer needed. After the laser trimming is performed, the final test is conducted so that the products or samples of the semiconductor device, passing the final test, are delivered to the customer.

Accordingly, the semiconductor device production method and the semiconductor device of the present invention are effective in reducing the amount of stock needed and in shortening the period from the receiving of the customer's order to the delivery of the products or samples to the customer. It is possible for the semiconductor device production method and the semiconductor device of the present invention to provide speedy delivery of the products or samples to the customer in response to the customer's order and to easily obtain the customer satisfaction.

As the speedy delivery of the products or samples to the customer is possible, the semiconductor device production method and the semiconductor device of the present invention are effective in eliminating the need to always prepare a large stock for each of the samples of the semiconductor device that are expected to respectively meet various kinds of the customer demands, and effective in increasing the productivity.

According to the semiconductor device production method and the semiconductor device of the present invention, even when the electric properties of the circuit element of the adjustable circuit adjusted by an initially performed laser trimming are changed by the stress or heat during an extended period of time, the electric properties of the circuit element can be restored to the initial level by a subsequent laser trimming.

What is claimed is:

1. A semiconductor device production method for producing a semiconductor device in which an adjustable circuit is formed on a semiconductor chip, the adjustable circuit having a circuit element with electric properties that are adjustable through a laser trimming, the production method comprising:

packaging the semiconductor chip with a covering material which effects focusing of a laser beam passing therethrough, the laser beam being within a predetermined range of wavelength having sufficient energy to cut part of the adjustable circuit;

surface treating the covering material to allow the laser beam passing therethrough to more easily focus; and trimming part of the adjustable circuit to obtain a target value for the adjustable circuit by focusing, after the packaging step and surface treating step, the laser beam onto the adjustable circuit from an upper surface of the semiconductor chip through the covering material.

2. The production method according to claim 1, wherein the adjustable circuit comprises a ladder resistor, and, in the trimming step, part of the ladder resistor is cut to obtain a target value of resistance of the ladder resistor by focusing the laser beam onto the ladder resistor from the upper surface of the semiconductor chip through the covering material.

3. The production method according to claim 1, wherein the covering material comprises a molded resin with a satin finished surface, and a rate of absorption of energy of said covering material to the laser beam is below 20%.

4. The production method according to claim 1, wherein the predetermined range of wavelength of the laser beam is approximately in a range between 300 nm and 1100 nm.

5. A semiconductor device production method, for producing a semiconductor device in which an adjustable circuit is formed on a semiconductor chip, the adjustable circuit having a circuit element with electric properties that are adjustable through a laser trimming, the production method comprising the steps of:

packaging the semiconductor chip with a transparent material which allows penetration of a laser beam within a predetermined range of wavelength having sufficient energy to cut part of the adjustable circuit, the transparent material comprising a molded resin with a satin finished surface, and a rate of absorption of energy of the transparent material to the laser beam is below 20%; and trimming part of the adjustable circuit to obtain a target value for the adjustable circuit by focusing, after the packaging step, the laser beam onto the adjustable circuit from an upper surface of the semiconductor chip through the transparent material; and surface treating, following the packaging step and preceding the trimming step, the satin finished surface of the transparent material to which the laser beam is incident by applying one of water and oil to the satin finished surface of the transparent material, so as to allow the satin finished surface of the transparent material after the surface treatment to easily pass the laser beam.

6. A semiconductor device production method for producing a semiconductor device in which an adjustable circuit is formed on a semiconductor chip, the adjustable circuit having a circuit element with electric properties that are adjustable through a laser trimming, the production method comprising:

packaging the semiconductor chip with a covering material which alters at least one property of a laser beam passing therethrough, the laser beam being within a predetermined range of wavelength having sufficient energy to cut part of the adjustable circuit;

surface treating the covering material to alter at least one property of the laser beam passing therethrough, to allow laser trimming to be performed; and trimming part of the adjustable circuit to obtain a target value for the adjustable circuit by focusing, after the packaging step and surface treating step, the laser beam onto the adjustable circuit from an upper surface of the semiconductor chip through the covering material.

7. The production method according to claim 6, wherein the at least one property altered is a focus of the laser beam.

* * * * *